(12) United States Patent
Piazzon

(10) Patent No.: US 12,255,594 B2
(45) Date of Patent: Mar. 18, 2025

(54) AMPLIFIER WITH A CONVERTING CIRCUIT WITH REDUCED INTRINSIC TIME CONSTANT

(71) Applicant: Huawei Technologies Co., Ltd., Shenzhen (CN)

(72) Inventor: Luca Piazzon, Segrate (IT)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 596 days.

(21) Appl. No.: 17/561,053

(22) Filed: Dec. 23, 2021

(65) Prior Publication Data
US 2022/0116003 A1   Apr. 14, 2022

Related U.S. Application Data

(63) Continuation of application No. PCT/EP2019/066772, filed on Jun. 25, 2019.

(51) Int. Cl.
| H03F 3/45 | (2006.01) |
| H03F 3/00 | (2006.01) |
| H03K 19/09 | (2006.01) |
| H03K 19/17784 | (2020.01) |

(52) U.S. Cl.
CPC ......... *H03F 3/45497* (2013.01); *H03F 3/005* (2013.01); *H03K 19/09* (2013.01); *H03K 19/17784* (2013.01)

(58) Field of Classification Search
CPC ..... H03F 3/45497; H03F 3/005; H03K 19/09; H03K 19/17784
See application file for complete search history.

(56) References Cited

U.S. PATENT DOCUMENTS

| 4,292,598 A * | 9/1981 | Yasumura | H03G 3/3052 330/281 |
| 5,892,381 A * | 4/1999 | Koifman | G05F 1/468 327/143 |
| 6,806,744 B1 | 10/2004 | Bell et al. | |
| 2006/0044072 A1 | 3/2006 | Kucharski | |
| 2007/0279083 A1* | 12/2007 | Padilla | H04L 25/0264 326/29 |
| 2010/0007419 A1* | 1/2010 | Gilbert | H03F 3/211 330/254 |
| 2010/0253431 A1* | 10/2010 | Fujiwara | G05F 1/575 330/253 |
| 2014/0120852 A1* | 5/2014 | Ashizuka | H04B 1/0458 455/127.1 |

(Continued)

OTHER PUBLICATIONS

Toumazou, C. et al., "Analogue Design Techniques for High Speed GaAs Operational Amplifiers," IEEE International Symposium on Circuits and Systems, 1988, 4 pages.

*Primary Examiner* — Patricia T Nguyen
(74) *Attorney, Agent, or Firm* — SLATER MATSIL, LLP

(57) ABSTRACT

An amplifier for converting a differential input signal to a single ended output signal. In particular, the amplifier including a converting circuit for converting a differential input signal into a single ended output signal, the converting circuit including an input section for receiving the differential input signal and an output section including an output port for providing the single ended output signal, where the output section includes a capacitive element configured to reduce an intrinsic time constant of the converting circuit.

19 Claims, 11 Drawing Sheets

(56) References Cited

U.S. PATENT DOCUMENTS

2014/0376582 A1    12/2014  Kao et al.
2017/0170820 A1*    6/2017  Nakamori ........ H03K 17/08116
2018/0123524 A1     5/2018  Polesel et al.
2022/0181133 A1*    6/2022  Komander ................ H03F 1/32

* cited by examiner

AMPLIFIER WITH A CONVERTING CIRCUIT WITH REDUCED INTRINSIC TIME CONSTANT

CROSS-REFERENCE TO RELATED APPLICATIONS

This application is a continuation of International Application No. PCT/EP2019/066772, filed on Jun. 25, 2019, the disclosure of which is hereby incorporated by reference in its entirety.

TECHNICAL FIELD

The present disclosure relates to an amplifier for converting a differential input signal to a single ended output signal. In particular, the present disclosure relates to an amplifier with reduced intrinsic time constant of said converting. The present disclosure also relates to a method for operating such an amplifier.

BACKGROUND

In a transmitter (e.g. for optical communication), a high speed digital source generates a differential signal. At the same time, an electro-optical modulator often requires a single-ended input signal. To this purpose, a driver amplifier that converts a differential input to single-ended output is used.

A key requirement to improve the data rate of an electro-optical transmitter is its bandwidth. The wider the bandwidth is, the higher is the data rate. Solutions that allow to obtain a differential input to single-ended output driver amplifier with wide bandwidth are of interest to a user in order to maximize a data rate of an electro-optical transmitter.

A typical differential input to single-ended output driver amplifier scheme used in the prior-art is shown in FIG. 10. It is composed of three blocks: a differential input to differential output block, a differential input to single-ended output block and a single-ended input to single-ended output block. Each one of the three blocks described above can be composed by one or more than one internal gain stage. The differential input to single-ended output block is realized by means of a differential pair with two inputs (Vin+ and Vin−) and only one output (Vout). The differential pair, in its simplest form, is composed of two identical transistors (Q1 and Q2), a current source (IS), two identical load resistors (RD) and a bias voltage (VD). The two capacitors CDS in FIG. 10 are not components of the differential pair. They refer to an intrinsic output parasitic capacity of the two transistors. They are shown in FIG. 10 because of importance to estimate the differential input to single-ended output voltage gain (AV) of the differential pair, as reported in the following equation.

$$A_V = \frac{g_m}{2} \cdot \frac{R_D}{1 + j\omega \cdot R_D \cdot C_{DS}}, \quad (1)$$

where $\omega$ is the angular frequency and $g_m$ is the transconductance of the transistors. From equation (i) it is possible to estimate the bandwidth, i.e. the angular frequency at which the voltage gain is 3 dB lower than the DC value, of the differential input to single-ended output driver amplifier in prior-art, which is expressed in the following equation.

$$\omega_{3dB} = \frac{1}{R_D \cdot C_{DS}} \quad (2)$$

A typical behavior of the voltage gain versus frequency is reported in FIG. 11. The 3 dB bandwidth is also highlighted in the plot.

By considering equation (2), it is possible to note that the bandwidth of the conventional differential input to single-ended output driver amplifier is basically limited by the parasitic capacitor CDS, which is dependent on the transistor size (Q1 and Q2). With lower transistor size the size of the parasitic capacitor CDS is reduced, however also the gain and the linearity of the differential pair are reduced.

In conclusion, the solution proposed in the prior-art only allows to achieve a limited bandwidth in practical design, because a trade-off regarding gain and linearity exists. As a result, there is a need for an amplifier that overcomes the disadvantages listed above.

SUMMARY

In view of the above-mentioned problems and disadvantages, embodiments of the present invention aims to improve the conventional amplifier.

An object is to realize a differential input to single-ended output driver amplifier with optimum wider bandwidth. This aspect e.g. is beneficial for transmitters for optical communications, where a broadband driver amplifier is used to increase the level of a high speed digital source in order to supply enough power to properly drive an electro-optical modulator.

An object is in particular achieved by a differential to single ended converting circuit including a component connected to an output closed path of the differential to single ended converting circuit, adapted to reduce the intrinsic time constant of the circuit. The component may be a capacitor added to the differential to single ended converting circuit (e.g. a differential pair that converts a differential input to single-ended output). The resulting transfer function allows wider bandwidth without affecting other key performance values of the amplifier. The capacitor e.g. may be chosen to be larger than a parasitic capacitance of the differential to single ended converting circuit.

An object is achieved by the solution provided in the enclosed independent claims. Advantageous implementations of the present invention are further defined in the dependent claims.

According to a first aspect, the present invention provides an amplifier comprising a converting circuit for converting a differential input signal into a single ended output signal, the converting circuit including an input section for receiving the differential input signal and an output section including an output port for providing the single ended output signal, wherein the output section comprises a capacitive element configured to reduce an intrinsic time constant of the converting circuit.

This is beneficial, as a differential input to single-ended output driver amplifier with optimum wider bandwidth can be provided.

In an implementation form of the first aspect, the input section is connected to the output section through a first node and the output port, wherein the capacitive element is connected to the first node.

In particular, the capacitive element is connected to a path which is opposite to the path including the output port.

This ensures that the capacitive element reduces the time constant.

In a further implementation form of the first aspect, the capacitance of the capacitive element is larger than an output parasitic capacitance of the input section.

In a further implementation form of the first aspect, the capacitance of the capacitive element is larger than 4/3 times of the output parasitic capacitance of the input section.

In particular the capacitance of the capacitive element is between 2.6 times and 3.0 times of the output parasitic capacitance of the input section, for example between 2.7 times and 2.9 times of the output parasitic capacitance of the input section.

In particular the capacitance of the capacitive element basically is 2.8 of times the output parasitic capacitance of the input section.

In a further implementation form of the first aspect, the input section comprises a first input port, a second input port, a first transistor, a second transistor and a current supply port, and wherein the first transistor is connected to the output section, to the first input port and to the current supply port, wherein the second transistor is connected to the output section, to the second input port, and to the current supply port.

In particular, the current supply port comprises a current source and/or a resistor. In particular, the current source and/or the resistor can be further connected to a ground potential.

In a further implementation form of the first aspect, the capacitive element is connected to a closed output path of the converting circuit.

In a further implementation form of the first aspect, the output parasitic capacitance of the input section is based on the output parasitic capacitance of the first transistor and/or the output parasitic capacitance of the second transistor.

In particular, the output parasitic capacitance of the input section equals the output parasitic capacitance of the first transistor and/or the output parasitic capacitance of the second transistor.

In a further implementation form of the first aspect, the output section further comprises a first resistor, a second resistor, and a voltage supply port, and the first resistor is connected to the input section, to the voltage supply port and to the second resistor, wherein the second resistor is connected to the input section.

In particular, the voltage supply port can be connected to a voltage source. In particular, the voltage source can be connected to a ground potential.

In a further implementation form of the first aspect, the first resistor of the output section is connected to the first transistor of the input section, and the second resistor of the output section is connected to the second transistor of the input section.

In a further implementation form of the first aspect, the output port is connected to the second resistor, and the capacitive element is connected to the first resistor.

In a further implementation form of the first aspect, the output port is connected to the first resistor, and the capacitive element is connected to the second resistor.

In a further implementation form of the first aspect, the capacitive element comprises a stub or an interdigital capacitor, in particular wherein the stub includes a distributed stub.

In a further implementation form of the first aspect, the capacitive element is further connected to a ground potential.

In a further implementation form of the first aspect, the capacitive element is further connected to the voltage supply port.

According to a second aspect, the present invention provides a method for operating an amplifier, the method comprising the step of receiving, by an input section of a converting circuit of the amplifier, a differential input signal, converting, by the converting circuit, the differential input signal into a single ended output signal, reducing, by a capacitive element of the output section, an intrinsic time constant of the converting circuit, providing, by an output section of the converting circuit, the single ended output signal.

In an implementation form of the second aspect, the input section is connected to the output section through a first node and the output port, wherein the capacitive element is connected to the first node.

In particular, the capacitive element is connected to a path which is opposite to the path including the output port.

In a further implementation form of the second aspect, the capacitance of the capacitive element is larger than an output parasitic capacitance of the input section.

In a further implementation form of the second aspect, the capacitance of the capacitive element is larger than 4/3 times of the output parasitic capacitance of the input section.

In particular the capacitance of the capacitive element is between 2.6 times and 3.0 times of the output parasitic capacitance of the input section, for example between 2.7 times and 2.9 times of the output parasitic capacitance of the input section.

In particular the capacitance of the capacitive element basically is 2.8 of times the output parasitic capacitance of the input section.

In a further implementation form of the second aspect, the input section comprises a first input port, a second input port, a first transistor, a second transistor and a current supply port, wherein the first transistor is connected to the output section, to the first input port and to the current supply port, wherein the second transistor is connected to the output section, to the second input port, and to the current supply port.

In particular, the current supply port comprises a current source and/or a resistor. In particular, the current source and/or the resistor can be further connected to a ground potential.

In a further implementation form of the second aspect, the output parasitic capacitance of the input section is based on the output parasitic capacitance of the first transistor and/or the output parasitic capacitance of the second transistor.

In a further implementation form of the second aspect, the capacitive element is connected to a closed output path of the converting circuit.

In particular, the output parasitic capacitance of the input section equals the output parasitic capacitance of the first transistor and/or the output parasitic capacitance of the second transistor.

In a further implementation form of the second aspect, the output section further comprises a first resistor, a second resistor, and a voltage supply port, and the first resistor is connected to the input section, to the voltage supply port and to the second resistor, wherein the second resistor is connected to the input section.

In particular, the voltage supply port can be connected to a voltage source. In particular, the voltage source can be connected to a ground potential.

In a further implementation form of the second aspect, the first resistor of the output section is connected to the first transistor of the input section, and the second resistor of the output section is connected to the second transistor of the input section.

In a further implementation form of the second aspect, the output port is connected to the second resistor, and the capacitive element is connected to the first resistor.

In a further implementation form of the second aspect, the output port is connected to the first resistor, and the capacitive element is connected to the second resistor.

In a further implementation form of the second aspect, the capacitive element comprises a stub or an interdigital capacitor, in particular wherein the stub includes a distributed stub.

In a further implementation form of the second aspect, the capacitive element is further connected to a ground potential.

In a further implementation form of the second aspect, the capacitive element is further connected to the voltage supply port.

The method according to the second aspect and its implementation forms achieve the same advantages as the amplifier according to the first aspect and its respective implementation forms.

It has to be noted that all devices, elements, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF THE DRAWINGS

The above described aspects and implementation forms of the present invention will be explained in the following description of specific embodiments in relation to the enclosed drawings, in which.

DETAILED DESCRIPTION OF ILLUSTRATIVE EMBODIMENTS

Figure 1:
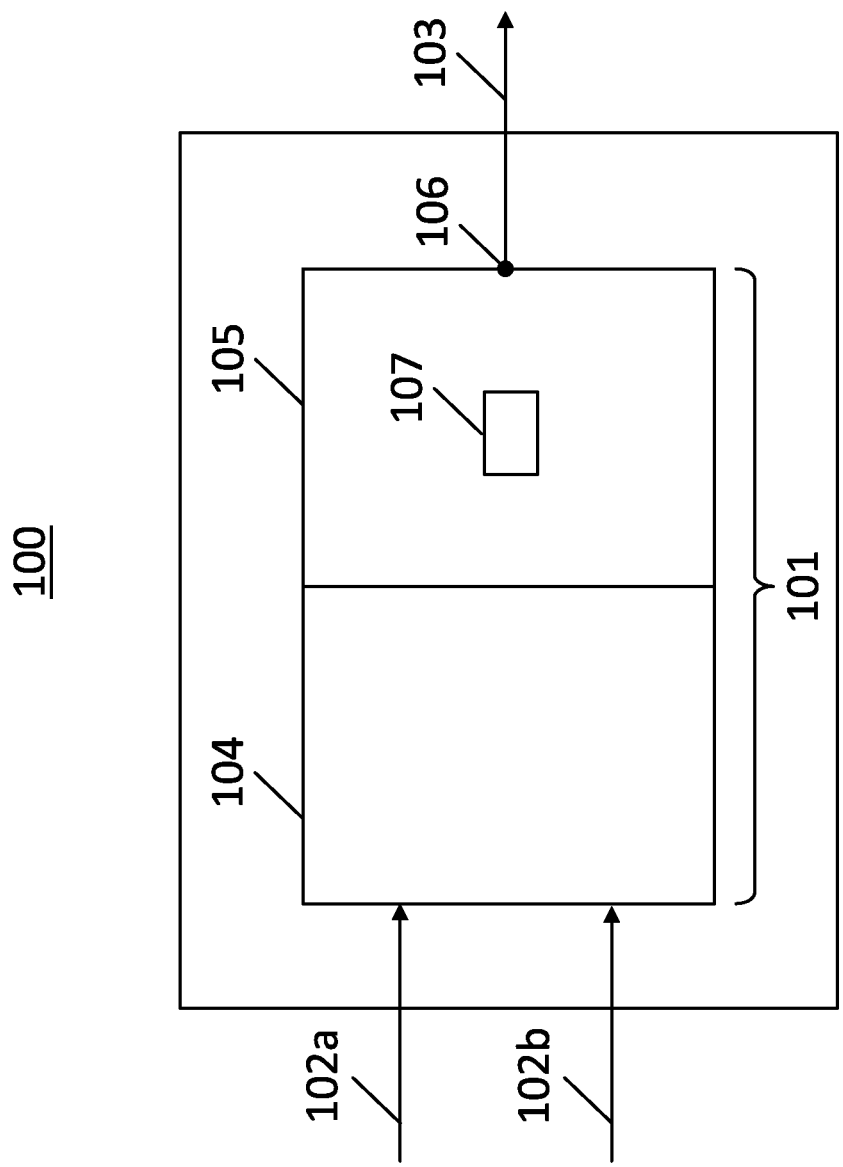
FIG. 1 shows an amplifier according to an embodiment of the present invention

FIG. 1 shows an amplifier 100 according to an embodiment of the present invention. The amplifier 100 comprises a converting circuit 101 for converting a differential input signal 102a, 102b into a single ended output signal 103. Thus, the converting circuit 101 includes an input section 104 for receiving the differential input signal 102a, 102b, and an output section 105 with an output port 106 for providing the single ended output signal 103. The output section 105 comprises a capacitive element 107 which is configured to reduce an intrinsic time constant of the converting circuit 101.

Figure 2:
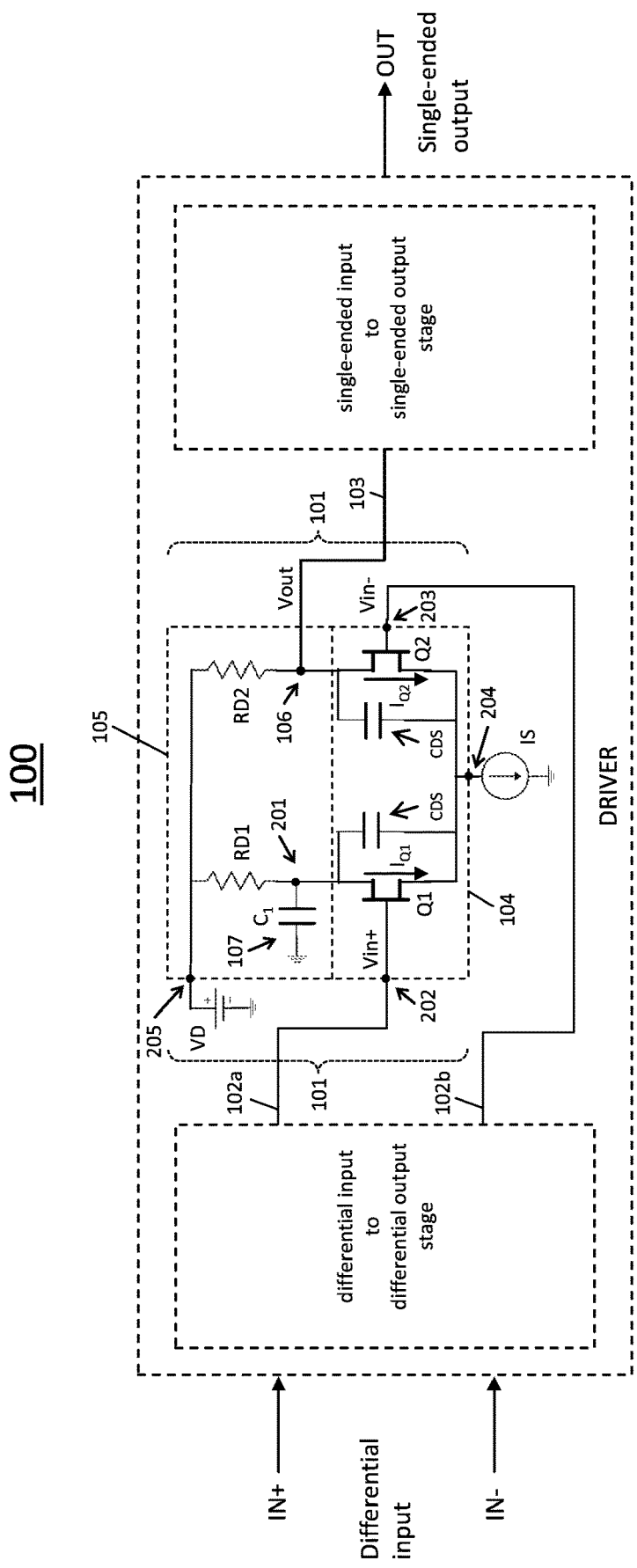
FIG. 2 shows an amplifier according to an embodiment of the present invention in more detail

FIG. 2 shows an amplifier 100 according to an embodiment of the present invention in more detail. The amplifier 100 as shown in FIG. 2 comprises the same features and functionality of the amplifier described in view of FIG. 1.

As shown in FIG. 2, in the differential input to single-ended output differential pair (which comprises a first node 201, a first 202 and second input port 203, a first transistor Q1 and a second transistor Q2, a first RD1 and second resistor RD2, an output port 106, a current supply port 204 and a voltage supply port 205) of the amplifier 100, a further capacitive element 107 (e.g. a capacitor C1) is added to an output closed path of the differential input to single-ended output differential pair. The output closed path comprises resistor RD1, drain-source terminals of transistor Q1, source-drain terminals of transistor Q2 and resistor RD2.

The differential input to single-ended output voltage gain of the differential pair according to an embodiment the present invention can be formulated according to the following equation.

$$A_V = g_m \cdot \frac{R_D \cdot (1 + j\omega \cdot R_D \cdot C_1)}{2 \cdot (1 + j\omega \cdot R_D \cdot (C_{DS} + C_1)) - \omega^2 \cdot R_D^2 \cdot C_{DS} \cdot C_1} \quad (3)$$

wherein $R_D = R_{D1} = R_{D2}$, and $C_{DS} = C_{DS1} = C_{DS2}$. That is, equation (3) can also be formulated as follows.

$$A_V = g_m \cdot \frac{\left(\frac{R_{D1} + R_{D2}}{2}\right) \cdot \left(1 + j\omega \cdot \left(\frac{R_{D1} + R_{D2}}{2}\right) \cdot C_1\right)}{2 \cdot \left(1 + j\omega \cdot \left(\frac{R_{D1} + R_{D2}}{2}\right) \cdot \left(\left(\frac{C_{DS1} + C_{DS2}}{2}\right) + C_1\right)\right) - \omega^2 \cdot \left(\frac{R_{D1} + R_{D2}}{2}\right)^2 \cdot \left(\frac{C_{DS1} + C_{DS2}}{2}\right) \cdot C_1}$$

By comparing the voltage gain of the proposed solution (equation 3) and the prior-art solution (equation 1) it can be noted that, if $C1 > 4/3 \cdot C_{DS}$, the 3 dB bandwidth of the proposed solution is wider than the prior-art solution.

The two capacitors CDS1 and CDS2 in FIG. 2 are not components of the differential pair. They refer to an intrinsic output parasitic capacity of the two transistors Q1, respectively Q2.

Figure 3:
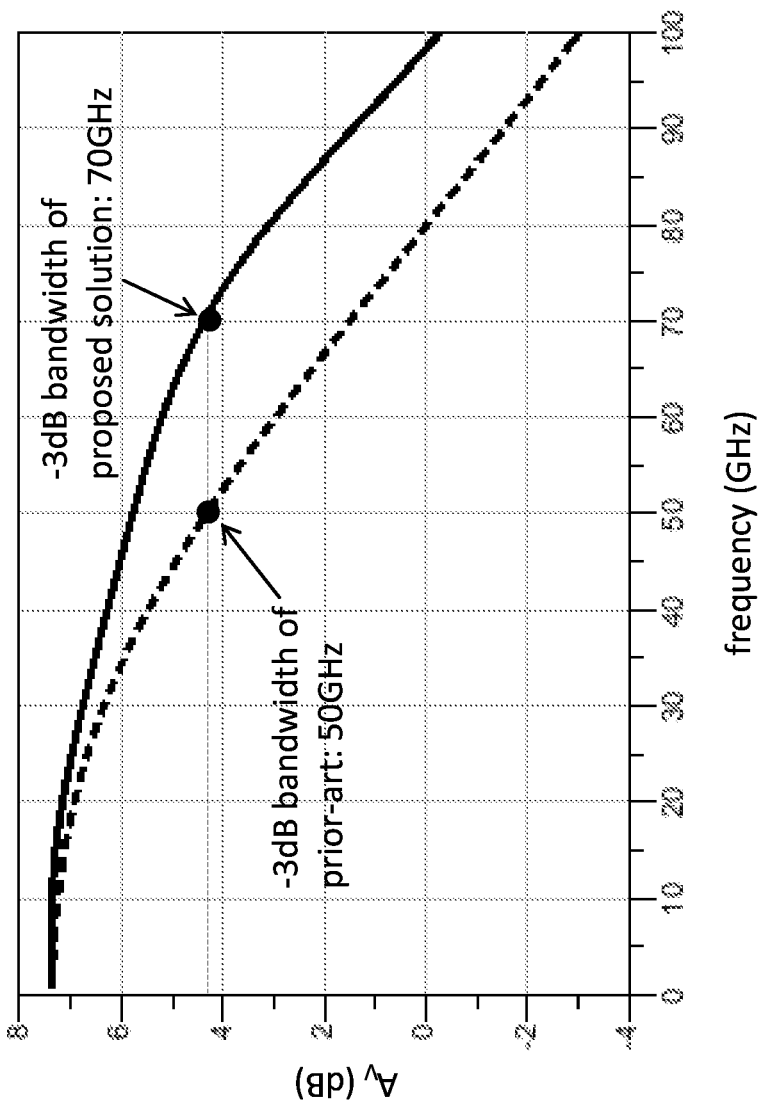
FIG. 3 shows an example of a voltage gain comparison between the solution according to an embodiment of the present invention and a prior-art solution

In order to better show the benefit of embodiments of the present invention, in view of FIG. 3 a differential input to single-ended output differential pair designed according an embodiment to the present invention is compared with a differential pair designed according to a prior-art solution.

For the comparison the same transistors (Q1 and Q2), same load resistors (RD1, RD2), same current source (IS) and same bias voltage (VD) are used in both cases. Moreover, the capacitor C1 used for the comparison is selected to be 2.8 times of CDS (which is an optional feature of embodiments of the present invention, that is the beneficial effect is also achieved with other ratios). The comparison between the resulting voltage gain of the two cases is reported in FIG. 3, where a solid line is the voltage gain of the solution according to embodiments of the present invention and a dashed line is the voltage gain of the prior-art solution. As it is possible to note, the solution of embodiments of the present invention allows to reach a much wider bandwidth with respect to the prior-art solution considering the same transistors, load resistors and biasing current and voltage, i.e. the same DC gain, linearity and power consumption.

Figure 4:
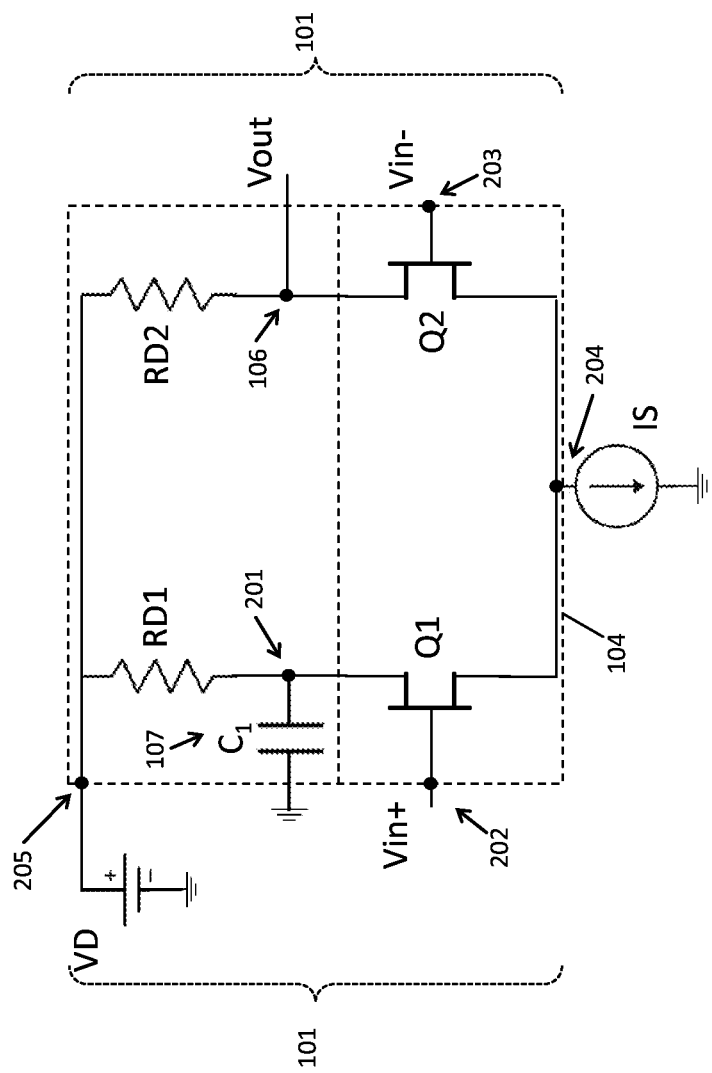
FIG. 4 shows a schematic view of another amplifier according to an embodiment of the present invention

FIG. 4 shows a schematic view of an amplifier 100 according to an embodiment of the present invention. The amplifier 100 of FIG. 4 includes the same features and functionality as the amplifiers 100 of FIG. 1 and FIG. 2 above.

The embodiment of the amplifier 100 as shown in FIG. 4 comprises a differential pair (transistor Q1, transistor Q2, first resistor RD1, second resistor RD2, voltage source VD and current source IS), a capacitor C1 107, a differential input (Vin+ and Vin− at the first input port 202, respectively the second input port 203) and a single a single-ended output 106 (providing Vout).

The size of the transistors Q1 and Q2 can be the same. They however can also be of different size. The value of the resistors RD1 and RD2 can be the same. They however can also be of different values. The value of the capacitor C1 is selected to optimize the bandwidth the driver amplifier. The embodiment shown in FIG. 4 is the easiest way to fully integrate the present invention, e.g. in Monolithic Microwave Integrated Circuit technologies.

Figure 5:
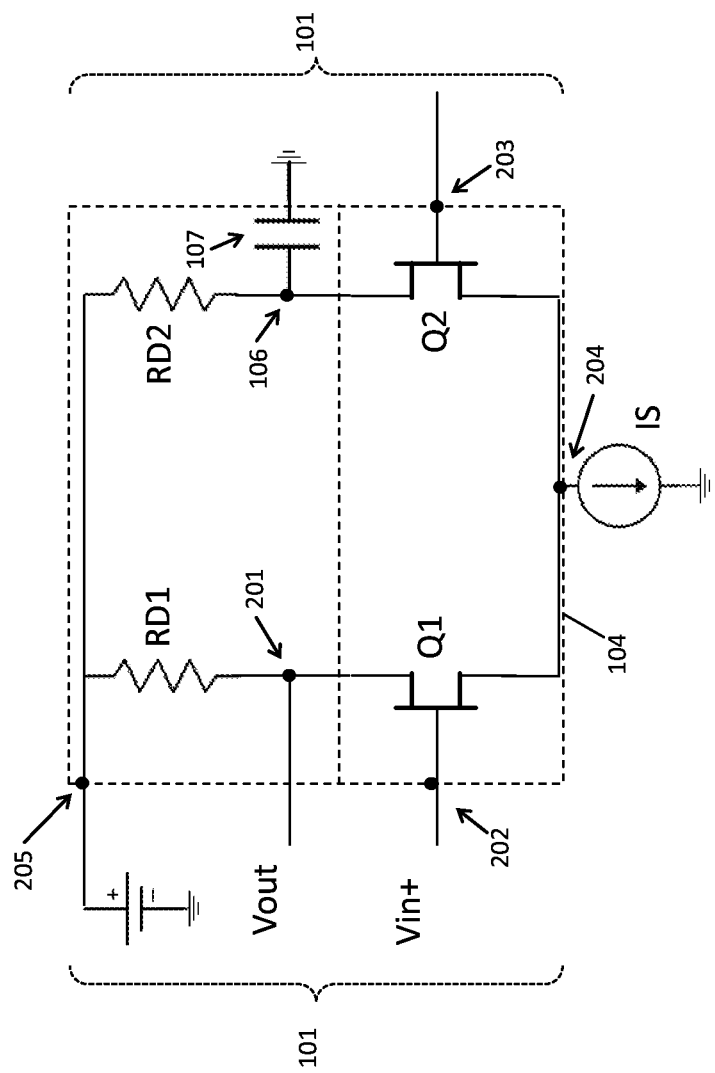
FIG. 5 shows a schematic view of another amplifier according to an embodiment of the present invention

An alternative embodiment of the present invention is shown in FIG. 5, in which the output voltage Vout and the capacitor C1 107 nodes are inverted.

Figure 6:
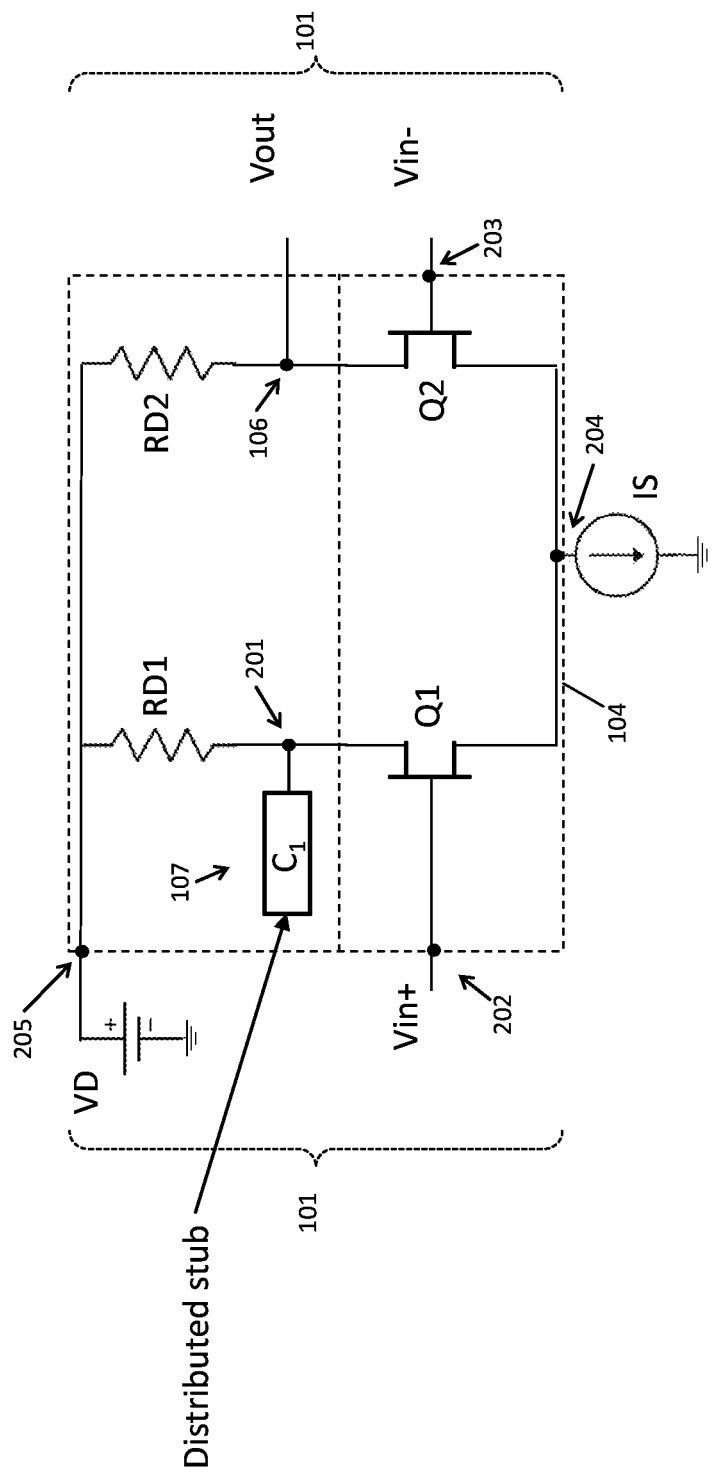
FIG. 6 shows a schematic view of another amplifier according to an embodiment of the present invention

A further alternative embodiment of the present invention is shown in FIG. 6, in which the capacitor C1 107 is implemented by means of a distributed stub.

Figure 7:
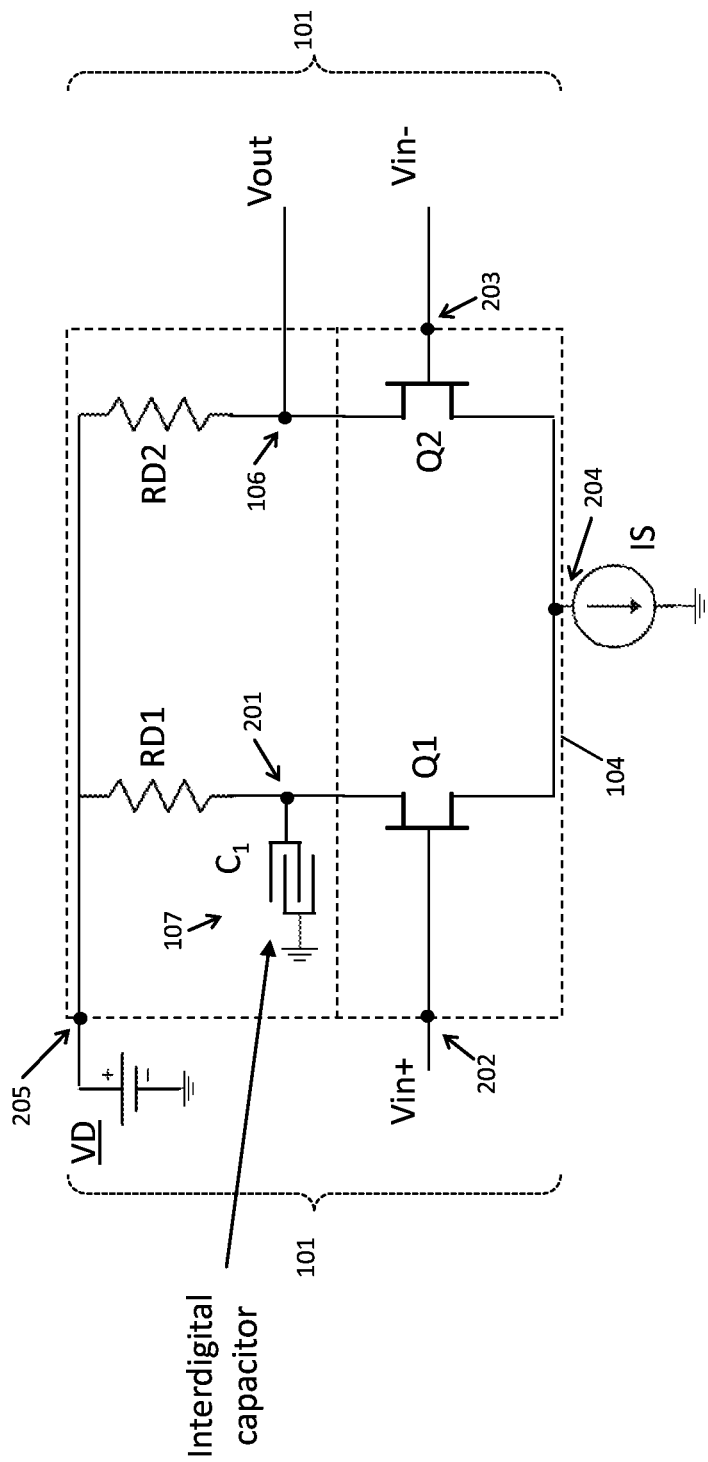
FIG. 7 shows a schematic view of another amplifier according to an embodiment of the present invention

A further alternative embodiment of the present invention is shown in FIG. 7, where the capacitor C1 107 is implemented by means of an interdigital capacitor.

Figure 8:
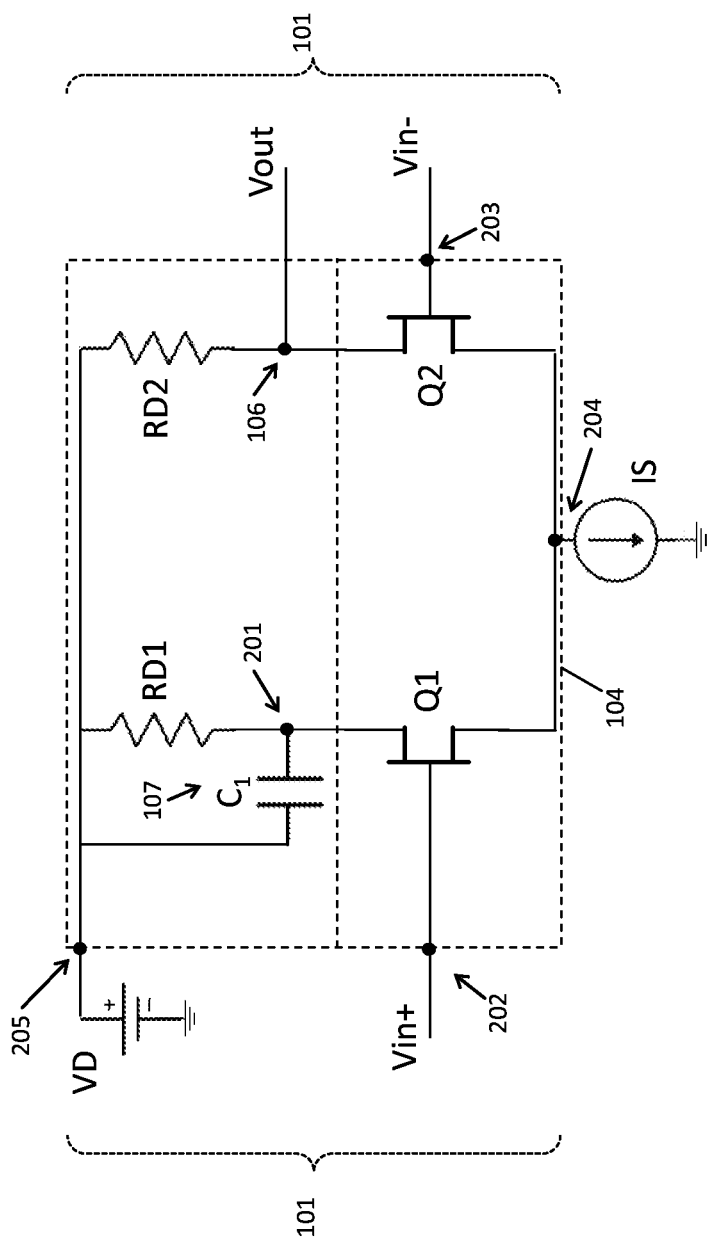
FIG. 8 shows a schematic view of another amplifier according to an embodiment of the present invention

A further alternative embodiment of the present invention is shown in FIG. 8, where the capacitor C1 107 is connected to the bias voltage supplier VD instead of ground.

Figure 9:
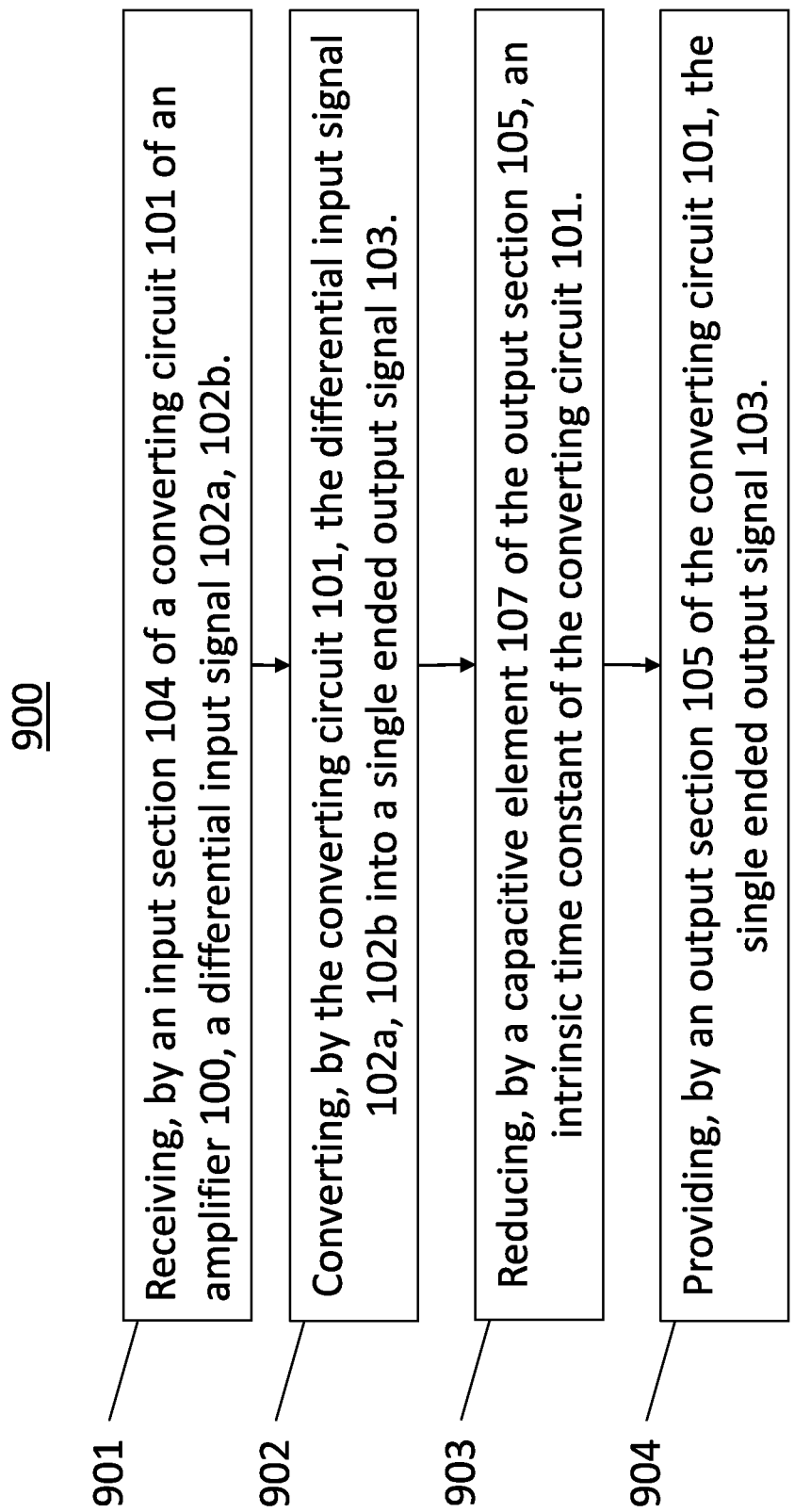
FIG. 9 shows a schematic view of a method according to an embodiment of the present invention
Figure 10:
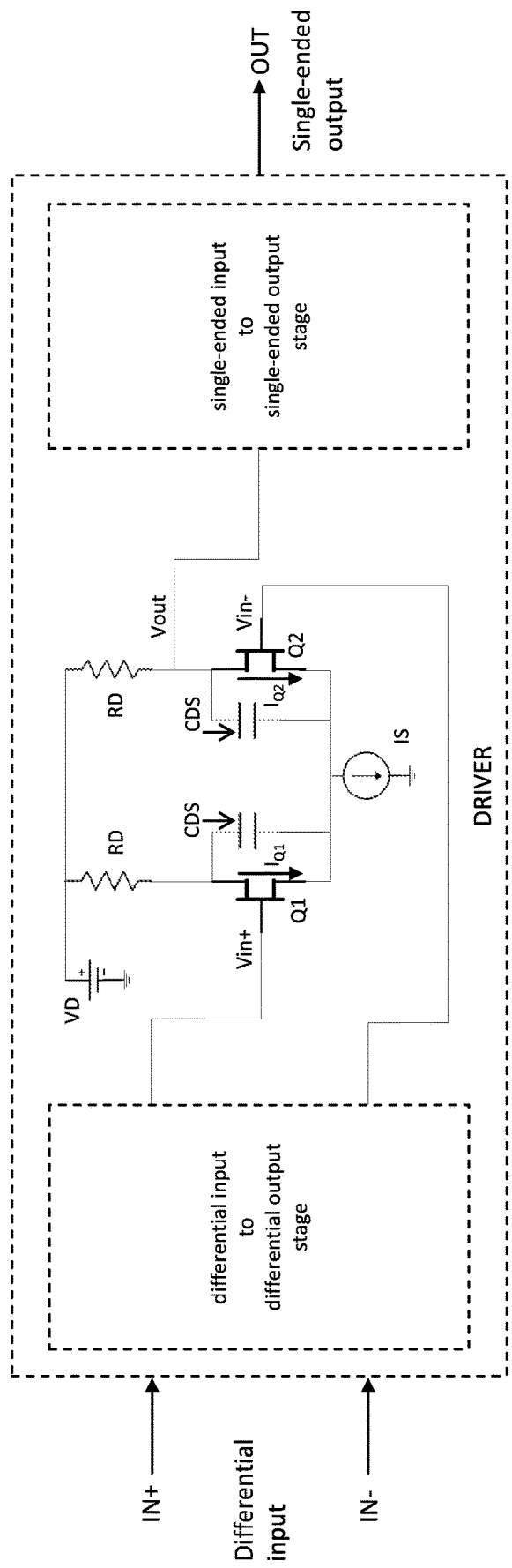
FIG. 10 shows a schematic view of an amplifier according to the prior art
Figure 11:
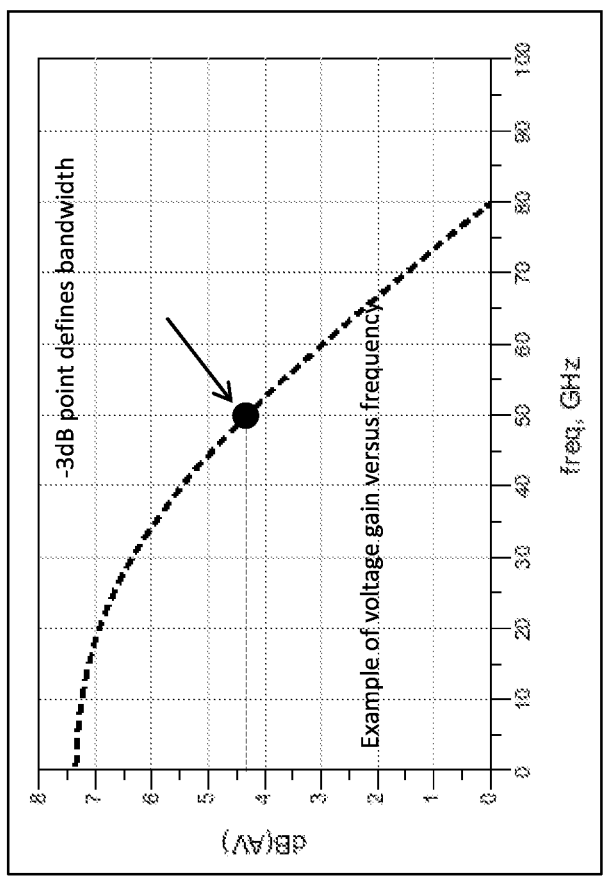
FIG. 11 shows an example of voltage gain versus frequency of a differential input to single-ended output driver amplifier according to the prior art.

FIG. 9 shows a schematic view of a method 900 for operating an amplifier boo, e.g. for an optical communication device. The method 900 comprises a first step of receiving 901, by an input section 104 of a converting circuit 101 of the amplifier 100, a differential input signal 102*a*, 102*b*. The method 900 comprises a further step of converting 902, by the converting circuit 101, the differential input signal 102*a*, 102*b* into a single ended output signal 103. The method 900 comprises a further step of reducing 903, by a capacitive element 107 of the output section 105, an intrinsic time constant of the converting circuit 101. The method 900 also comprises a step of providing 904, by an output section 105 of the converting circuit 101, the single ended output signal 103.

Embodiments of the present invention have been described in conjunction with various embodiments as examples as well as implementations. However, other variations can be understood and effected by those persons skilled in the art and practicing the claimed invention, from the studies of the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

What is claimed is:

1. An amplifier, comprising:
a converting circuit configured to convert a differential input signal into a single ended output signal, the converting circuit comprising:
an input section configured to receive the differential input signal; and
an output section comprising an output port configured to provide the single ended output signal, wherein the output section comprises a capacitive element configured to reduce an intrinsic time constant of the converting circuit, wherein a capacitance of the capacitive element is larger than an output parasitic capacitance of the input section.

2. The amplifier according to claim 1, wherein the input section is connected to the output section through a first node and the output port, and wherein the capacitive element is connected to the first node.

3. The amplifier according to claim 2, wherein the capacitance of the capacitive element is larger than 4/3 times of the output parasitic capacitance of the input section.

4. The amplifier according to claim 3, wherein the capacitive element is connected to a closed output path of the converting circuit.

5. The amplifier according to claim 1, wherein the input section comprises a first input port, a second input port, a first transistor, a second transistor and a current supply port, wherein the first transistor is connected to the output section, to the first input port and to the current supply port, and wherein the second transistor is connected to the output section, to the second input port, and to the current supply port.

6. The amplifier according to claim 5, wherein the output parasitic capacitance of the input section is related to an output parasitic capacitance of at least one of the first transistor or the second transistor.

7. The amplifier according to claim 5, wherein the output section further comprises a first resistor, a second resistor, and a voltage supply port, wherein the first resistor of the output section is connected to the input section, to the voltage supply port and to the second resistor, and wherein the second resistor of the output section is connected to the input section.

8. The amplifier according to claim 7, wherein the first resistor of the output section is connected to the first transistor of the input section, and wherein the second resistor of the output section is connected to the second transistor of the input section.

9. The amplifier according to claim 7, wherein the output port is connected to the second resistor of the output section, and wherein the capacitive element is connected to the first resistor of the output section.

10. The amplifier according to claim 7, wherein the output port is connected to the first resistor of the output section, and wherein the capacitive element is connected to the second resistor of the output section.

11. The amplifier according to claim 7, wherein the capacitive element is further connected to the voltage supply port.

12. The amplifier according to claim 1 wherein the capacitive element comprises at least one of a distributed stub or an interdigital capacitor.

13. The amplifier according to claim 1, wherein the capacitive element is further connected to a ground potential.

14. A method for operating an amplifier, comprising:
receiving, by an input section of a converting circuit of the amplifier, a differential input signal;
converting, by the converting circuit, the differential input signal into a single ended output signal;
reducing, by a capacitive element of an output section of the converting circuit, an intrinsic time constant of the converting circuit, wherein a capacitance of the capacitive element is larger than an output parasitic capacitance of the input section; and
providing, by the output section of the converting circuit, the single ended output signal.

15. An amplifier, comprising:
an input section comprising:
a differential pair connected between a first node and differential input ports; and
an output section connected to a voltage supply port and the first node, the output section comprising:
a capacitive element connected to the first node, wherein the capacitive element is associated with an intrinsic time constant of the amplifier, and wherein a capacitance of the capacitive element is larger than an output parasitic capacitance of the input section.

16. The amplifier of claim 15, wherein the differential input ports comprises a first input port and a second input port; and
wherein the differential pair comprises a first transistor connected between a current supply port and the first node, and having a first gate connected to the first input port, and wherein the differential pair further comprises a second transistor connected between an output port and the current supply port, and having a second gate connected to the second input port.

17. The amplifier of claim 16, wherein the capacitive element is connected between the first node and a ground.

18. The amplifier of claim 16, wherein the capacitive element is one of a distributed stub or an interdigital capacitor.

19. The amplifier of claim 16, further comprising:
a bias voltage element connected to the voltage supply port;
a first resistor connected between the first node and the voltage supply port; and
a second resistor connected between the output port and the voltage supply port.

\* \* \* \* \*